United States Patent
Chen et al.

(10) Patent No.: US 12,432,882 B2
(45) Date of Patent: Sep. 30, 2025

(54) FLEXIBLE VAPOR CHAMBER

(71) Applicant: Auras Technology Co., Ltd., New Taipei (TW)

(72) Inventors: Chih-Wei Chen, New Taipei (TW); Che-Wei Kuo, New Taipei (TW); Tien-Yao Chang, New Taipei (TW); Hsiang-Chih Chuang, New Taipei (TW); Pin-Jei Chen, New Taipei (TW); Tsung-Min Liu, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 280 days.

(21) Appl. No.: 17/960,269

(22) Filed: Oct. 5, 2022

(65) Prior Publication Data

US 2023/0156968 A1    May 18, 2023

Related U.S. Application Data

(60) Provisional application No. 63/303,263, filed on Jan. 26, 2022, provisional application No. 63/280,870, filed on Nov. 18, 2021.

(51) Int. Cl.
*H05K 7/20* (2006.01)
*G06F 1/20* (2006.01)

(52) U.S. Cl.
CPC .......... *H05K 7/2039* (2013.01); *G06F 1/206* (2013.01); *H05K 7/20136* (2013.01); *H05K 7/20254* (2013.01); *H05K 7/20263* (2013.01); *H05K 7/20272* (2013.01)

(58) Field of Classification Search
CPC ............ H05K 7/2039; H05K 7/20254; H05K 7/20136; H05K 7/20236; H05K 7/20272; G06F 1/206
USPC ..................................... 165/104.26
See application file for complete search history.

(56) References Cited

U.S. PATENT DOCUMENTS

| | | | |
|---|---|---|---|
| 11,543,188 B2 * | 1/2023 | Tan | H05K 7/20336 |
| 11,946,699 B2 * | 4/2024 | Liu | F28D 15/0233 |
| 11,971,219 B2 * | 4/2024 | Tan | F28D 15/0233 |
| 2019/0354148 A1 * | 11/2019 | Delano | G06F 1/203 |
| 2020/0326134 A1 * | 10/2020 | Chen | H01L 23/427 |
| 2023/0354553 A1 * | 11/2023 | Ohyama | H05K 7/20336 |

* cited by examiner

*Primary Examiner* — Jon T. Schermerhorn, Jr.
(74) *Attorney, Agent, or Firm* — Muncy, Geissler, Olds & Lowe, P.C.

(57) ABSTRACT

A flexible vapor chamber includes a first flexible casing, a second flexible casing, a plurality of capillary strips and a plurality of inner capillary layers. The capillary strips are installed between the first flexible casing and the second flexible casing, and the inner capillary layers are arranged between the first flexible casing and the second flexible casing, and the capillary strips.

20 Claims, 8 Drawing Sheets

FLEXIBLE VAPOR CHAMBER

RELATED APPLICATIONS

This application claims priority to U.S. Provisional Application Ser. No. 63/280,870, filed Nov. 18, 2021 and U.S. Provisional Application Ser. No. 63/303,263, filed Jan. 26, 2022, the disclosures of which are incorporated herein by reference in their entireties.

TECHNICAL FIELD

The present disclosure generally relates to a vapor chamber. More particularly, the present disclosure relates to a flexible vapor chamber.

BACKGROUND

With the increasing computing capability of computers, the temperature control of various electronic components such as processing units is becoming more and more important. When the computing speed of the working chip (i.e. the heat source) in the electronic device continues to increase, the ambient temperature in the electronic device is increased so as to reduce the stability of the electronic device. In order to solve the above problem, people combine the heat pipes with heat dissipation fins to form the vapor chamber to contact the working chip, so that the heat of the working chip can be discharged out of the electronic device through the vapor chamber to control the temperature of the electronic device, and then maintain electronic device stability.

In addition, some electronic devices cannot utilize rigid vapor chambers due to the configuration requirement or the convenience of carrying. Therefore, the demand for flexible vapor chambers came into being. However, in the face of increasing technological progress, the thermal conductivity of the current flexible vapor chamber still has some poor performance problems. Therefore, there is a need to efficiently improve the flexible vapor chambers equipped in the electronic devices, which is also a challenge currently faced by those skilled in the art.

SUMMARY

One objective of the embodiments of the present invention is to provide a flexible vapor chamber to solve the problems mentioned above.

To achieve these and other advantages and in accordance with the objective of the embodiments of the present invention, as the embodiment broadly describes herein, the embodiments of the present invention provides a flexible vapor chamber. The flexible vapor chamber includes a first flexible casing, a second flexible casing, a plurality of capillary strips, and a plurality of inner capillary layers. The capillary strips are installed between the first flexible casing and the second flexible casing and the inner capillary layers are arranged between the capillary strips and the first flexible casing or the second flexible casing.

In some embodiments, the inner capillary layers include a plurality of metal wire meshes, a plurality of through holes or a polymeric mesh, and the capillary strips include a plurality of capillary fiber strips.

In some embodiments, the inner capillary layers respectively include a plurality of intersecting through holes, and the intersecting through holes on two adjacent inner capillary layers are at least partially overlapped.

In some embodiments, the inner capillary layers respectively include a plurality of crisscross through holes.

In some embodiments, one of the first flexible casing and the second flexible casing includes a flexible resin casing.

In some embodiments, the flexible resin casing is made of Polyimide (PI).

In some embodiments, a surface of the flexible resin casing includes a surface roughening layer, a nickel plating layer and a copper plating layer.

In some embodiments, the surface roughening layer, the nickel plating layer and the copper plating layer are sequentially formed on the surface of the flexible resin casing.

In some embodiments, the flexible resin casing further includes a first fluid reservoir, a second fluid reservoir and a plurality of connecting fluid reservoirs. The connecting fluid reservoirs are connected between the first fluid reservoir and the second fluid reservoir.

In some embodiments, the capillary strips traverse in the connecting fluid reservoirs.

In some embodiments, the flexible resin casing further includes a first bonding adhesive and a second bonding adhesive. The first bonding adhesive is disposed around a perimeter of the flexible resin casing and the second bonding adhesive surrounds inside the first bonding adhesive.

In some embodiments, the inner capillary layers are extended to positions of the first bonding adhesive and the second bonding adhesive so that the first bonding adhesive and the second bonding adhesive penetrate into a part of the inner capillary layers.

In some embodiments, the flexible vapor chamber further includes a plurality of supporting posts formed between the inner capillary layers and arranged between the capillary strips.

In some embodiments, the first flexible casing, the second flexible casing, the capillary strips and the inner capillary layers are formed a flexible connecting portion to connect to a first vapor chamber.

In some embodiments, the flexible connecting portion is further connected to a second vapor chamber, and the flexible connecting portion is arranged between the first vapor chamber and the second vapor chamber.

In some embodiments, the first vapor chamber and the second vapor chamber respectively include a first casing and a second casing, and partial perimeters, without connected to the flexible connecting portion, of the first casing and the second casing, are applied with a first bonding adhesive and a second bonding adhesive to bond the first casing to the second casing, wherein the second bonding adhesive is surrounded inside of the first bonding adhesive.

In some embodiments, the inner capillary layers are extended to positions of the first bonding adhesive and the second bonding adhesive so that the first bonding adhesive and the second bonding adhesive penetrate into a part of the inner capillary layers.

In some embodiments, the first vapor chamber and the second vapor chamber respectively include a first casing and a second casing, a plurality of degassing holes are formed on the first casing or the second casing, and a plurality of sealing films respectively seal the degassing holes after the flexible vapor chamber is filled with a working fluid and degassed.

In some embodiments, the sealing films, the first casing and the second casing are made of a same material.

In some embodiments, the first vapor chamber and the second vapor chamber are metal vapor chambers.

In some embodiments, the flexible vapor chamber further includes a fluid filling tube formed on a lateral side of the flexible connecting portion.

Therefore, according to the structures of the above embodiments, the present invention can provide a required flexible vapor chamber to install in a foldable electronic device so as to reduce the working temperature of the electronic element of the foldable electronic device. In addition, the flexible vapor chamber may combine with more than one metal vapor chamber to improve the heat dissipation efficiency of the flexible vapor chamber. Furthermore, the capillary strips and the inner capillary layers spanned across both ends of the flexible vapor chamber can further increase the heat dissipation efficiency of the flexible vapor chamber. The inner capillary layers may further include through holes to store the working fluid. In addition, the flexible vapor chamber may hide the fluid filling tube in the rotating shaft or bending mechanism of the electronic device.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
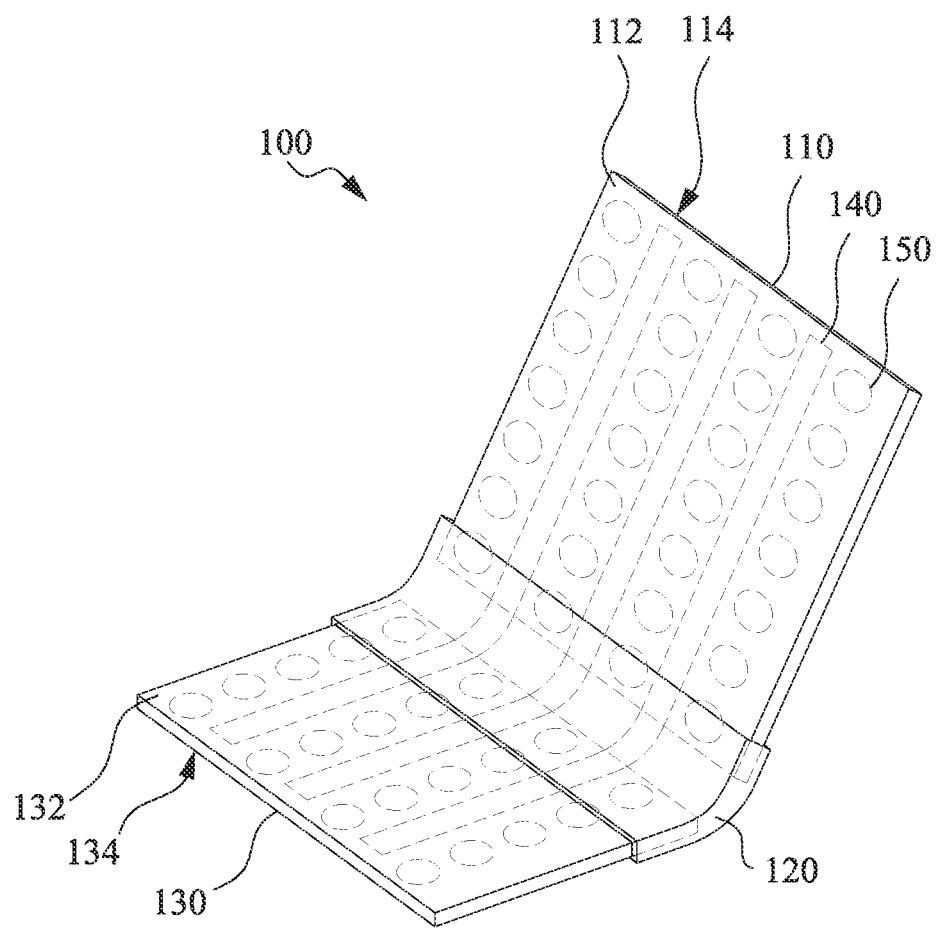
FIG. 1 illustrates a schematic perspective diagram showing a flexible vapor chamber according to one embodiment of the present invention.
Figure 2:
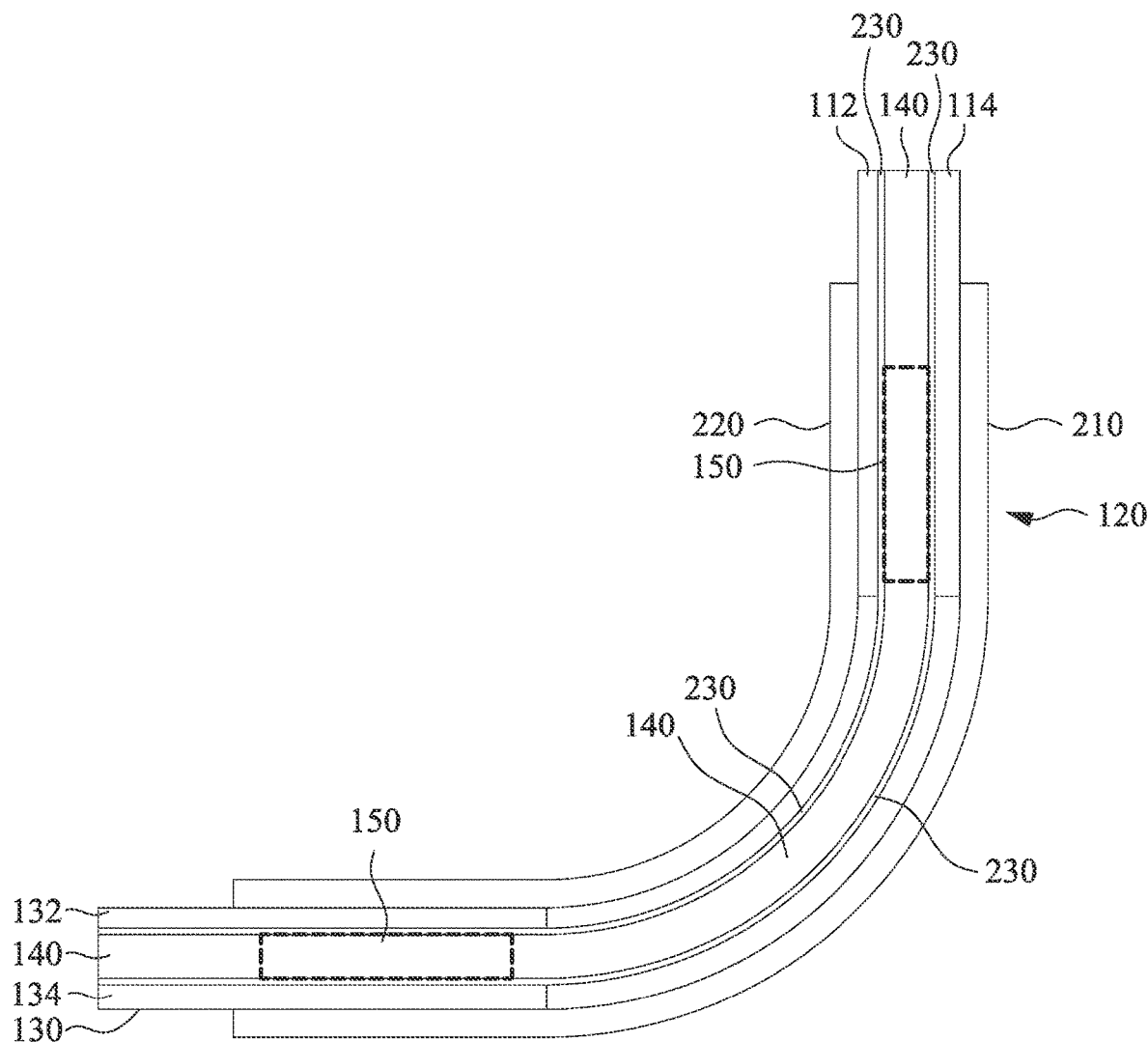
FIG. 2 illustrates a schematic partial side view of the flexible vapor chamber of FIG. 1.
Figure 3:
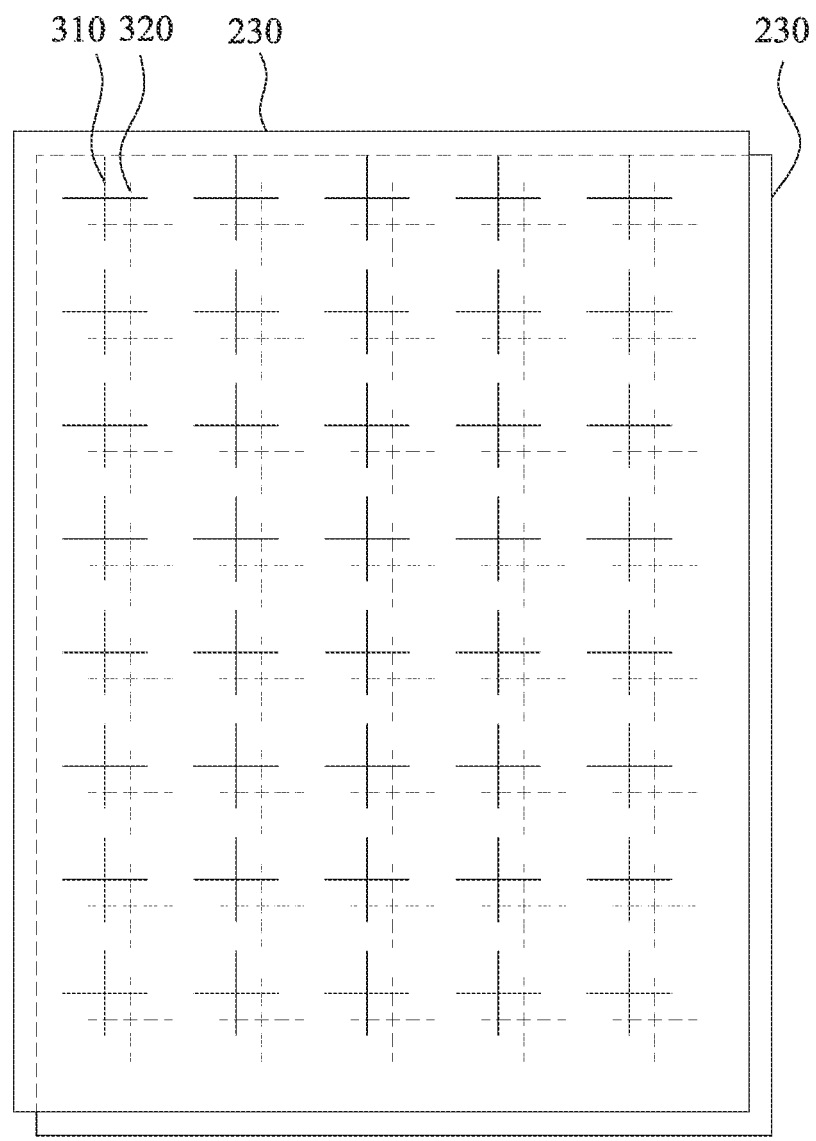
FIG. 3 illustrates a schematic view of inner capillary layers of the flexible vapor chamber of FIG. 1.
Figure 4:
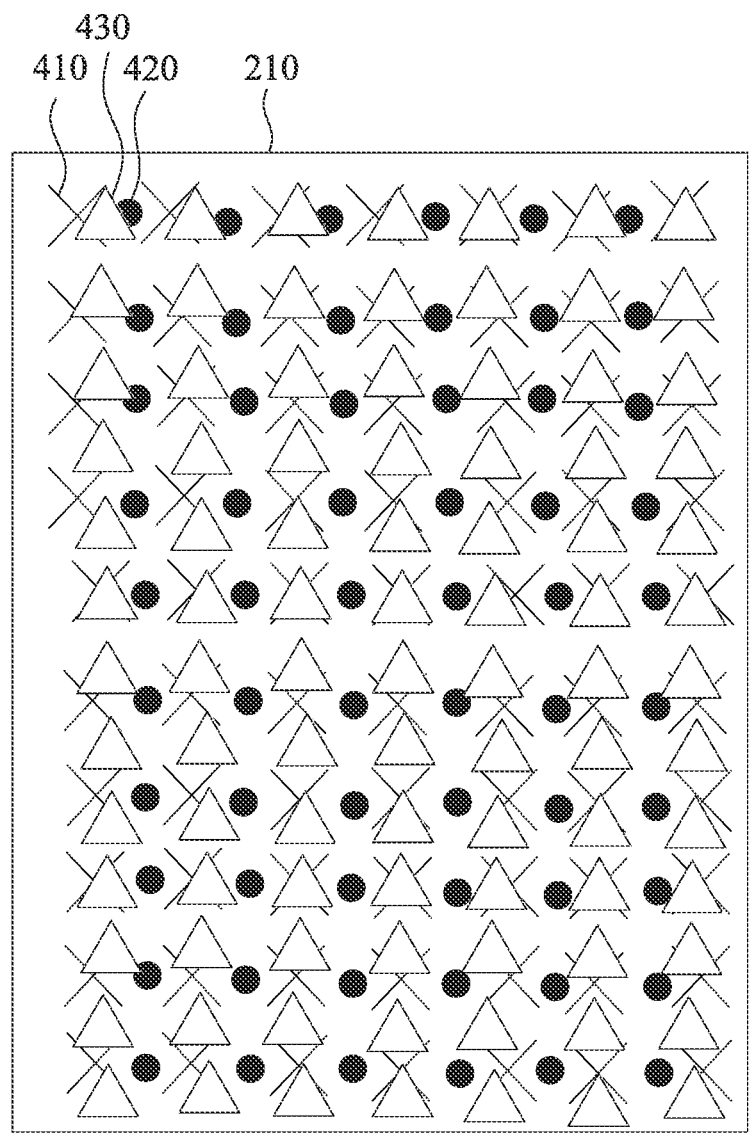
FIG. 4 illustrates a schematic view of one embodiment of a flexible casing of the flexible vapor chamber of FIG. 1.
Figure 5:
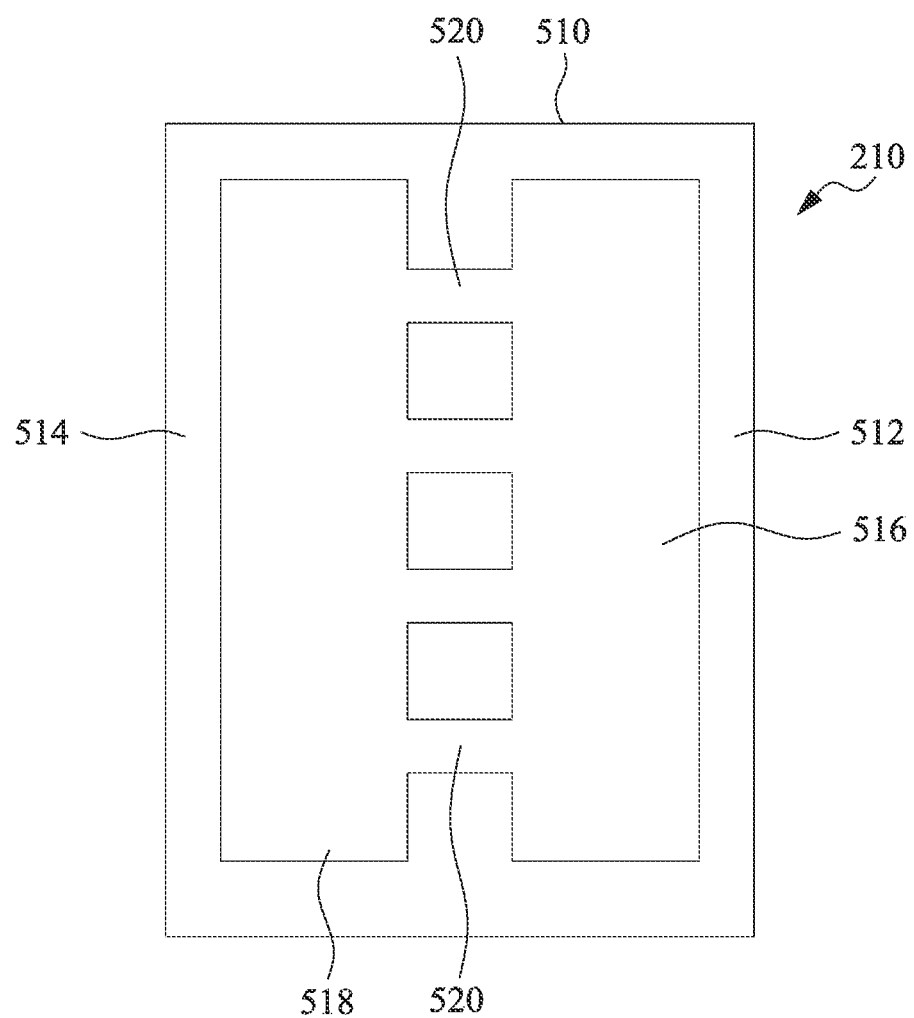
FIG. 5 illustrates a schematic view of another embodiment of a flexible casing of the flexible vapor chamber of FIG. 1.
Figure 6:
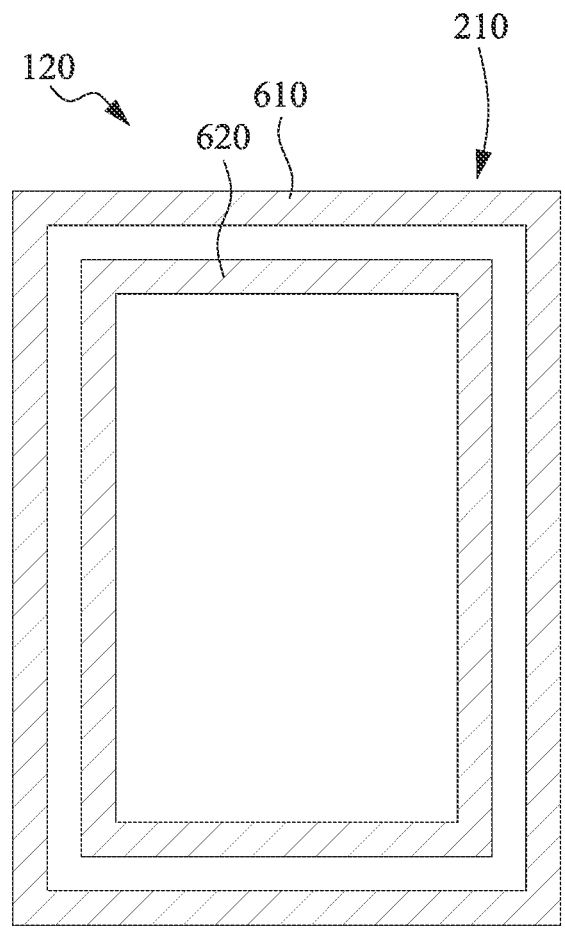
FIG. 6 illustrates a schematic view of further another embodiment of a flexible casing of the flexible vapor chamber of FIG. 1.
Figure 7:
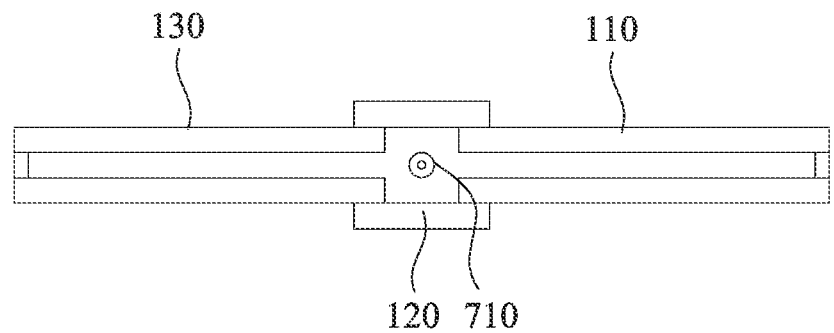
FIG. 7 illustrates a schematic perspective view of a flexible vapor chamber with a fluid filling tube equipped thereon.
Figure 7:
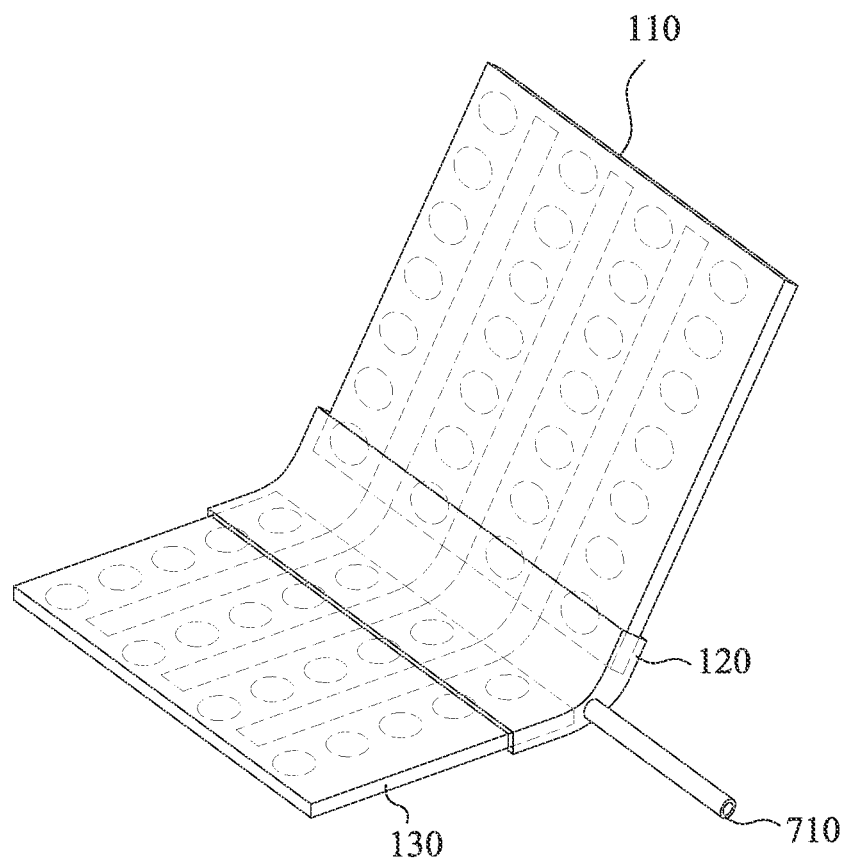

FIG. 1 is a schematic perspective diagram showing a flexible vapor chamber according to one embodiment of the present invention, FIG. 2 is a schematic partial side view thereof, and FIG. 3 is a schematic view of inner capillary layers thereof. FIGS. 4-6 are a plurality of embodiments of the flexible casing of the flexible vapor chamber of FIG. 1, and FIG. 7 is a schematic perspective view of the flexible vapor chamber with a fluid filling tube equipped thereon.

Figure 8:
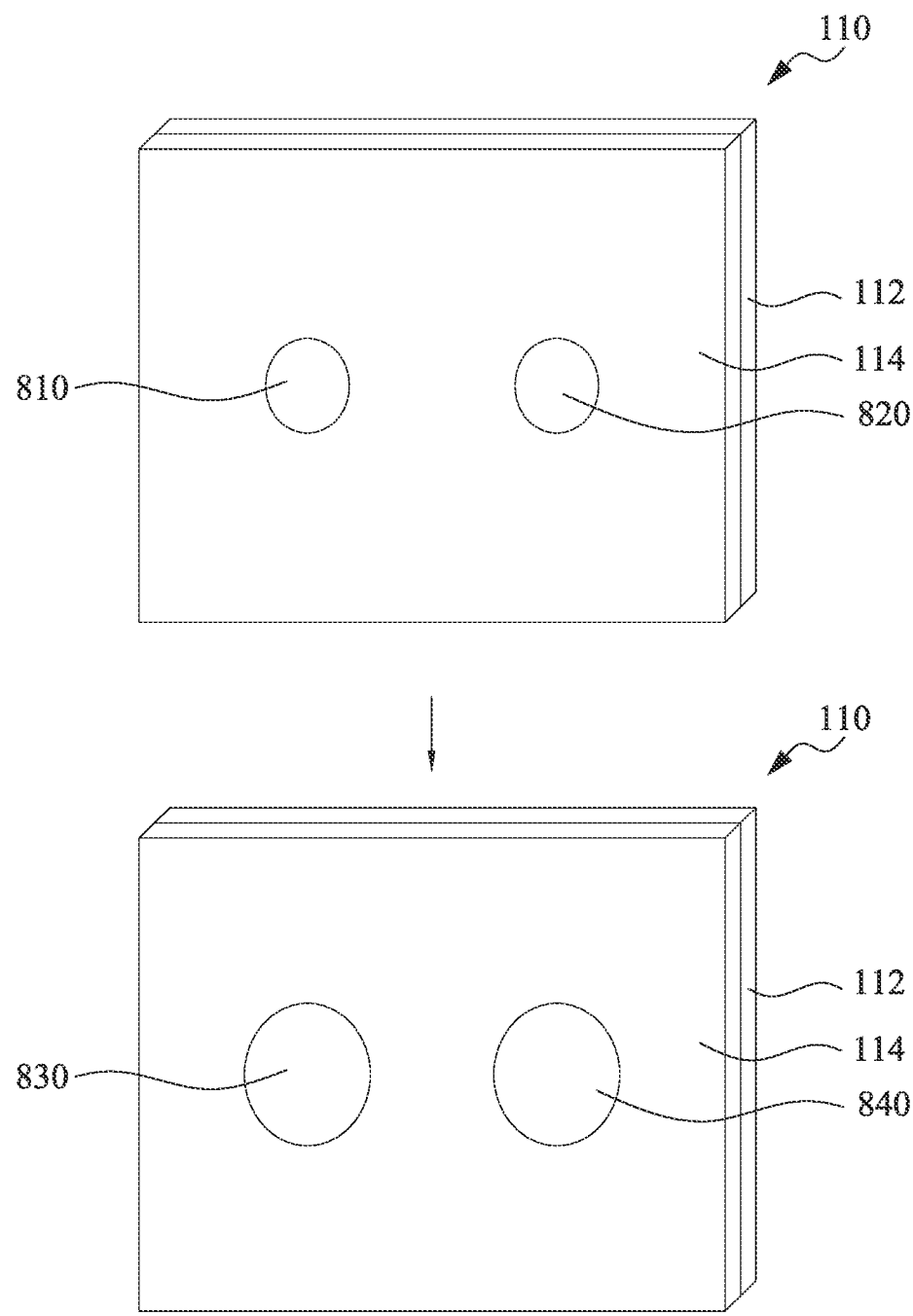
FIG. 8 illustrates a schematic view of an embodiment of a first vapor chamber and a second vapor chamber of the flexible vapor chamber of FIG. 1.

FIG. 8 is a schematic view of an embodiment of a first vapor chamber and a second vapor chamber thereof.

As shown in FIG. 1 and FIG. 2, the flexible vapor chamber 100 includes a flexible connecting portion 120, and the flexible connecting portion 120 includes a first flexible casing 210, a second flexible casing 220, a plurality of capillary strips 140 and a plurality of inner capillary layers 230. The capillary strips 140 are installed between the first flexible casing 210 and the second flexible casing 220, and two ends of the capillary strips 140 are extended to two ends of the flexible vapor chamber 100. The inner capillary layers 230 are arranged between the capillary strips 140 and the first flexible casing 210, and the second flexible casing 220. In addition, the flexible connecting portion 120 may form a flexible vapor chamber alone to dissipate the heat of a heat source, or the flexible connecting portion 120 may form a flexible vapor chamber together with the vapor chamber, for example, a first vapor chamber 110 and/or a second vapor chamber 130 to dissipate the heat of a heat source.

In some embodiments, the inner capillary layers 230 include inner metal or polymeric mesh, for example, metal or polymeric wire mesh or foil. In some embodiments, the inner capillary layers 230 includes, for example, a metal wire mesh layer, a polymeric wire mesh layer, a metal foil layer or a polymeric foil layer.

In some embodiments, referring to FIG. 3, the inner capillary layers 230 respectively include a plurality of first through holes 310 and a plurality of second through holes 320, for example, a plurality of intersecting through holes. The first through holes 310 and second through holes 320 respectively passing through two opposite surfaces of the inner capillary layers 230. In some embodiments, the intersecting through holes in two adjacent inner capillary layers 230 at least partially overlap with each other to increase a working fluid storage capacity of the inner capillary layers 230. In some embodiments, the first through holes 310 and the second through holes 320 may have any geometry shape, for example, crisscross shaped through holes, without departing from the scope and the spirit of the present invention.

In some embodiments, the first flexible casing 210 and the second flexible casing 220 can be a flexible resin casing. In some embodiments, the flexible resin casing can be made of polyimide (PI), without departing from the scope and the spirit of the present invention.

In some embodiments, referring to FIGS. 4-6, the first flexible casing 210 is taken as an exemplary embodiment, and the second flexible casing 220 and the first flexible casing 210 can be made by a same process and formed a same structure.

A surface of the first flexible casing 210 may further include a surface roughening layer 410, a nickel plating layer 420 and a copper plating layer 430 to form a capillary structure. In some embodiments, the nickel plating layer 420 is formed on the surface roughening layer 410, and the copper plating layer 430 is formed on the nickel plating layer 420 but not limited thereto. In addition, in a bonding process, the first flexible casing 210 and the second flexible casing 220 can be connected together and/or the first flexible casing 210 and the second flexible casing 220 can be connected to the casings of the first vapor chamber 110 and the second vapor chamber 130. For example, the first flexible casing 210 and the second flexible casing 220 can be treated by a surface treatment (e.g. forming a surface roughening layer 410) and then formed the metal plating layer (a nickel plating layer 420 and/or a copper plating layer 430) thereon, and the first flexible casing 210 and the second flexible casing 220 can be connected together in a vacuum and low temperature environment. In some embodiments, the first flexible casing 210 and the second flexible casing 220 can be connected together under an environment with a pressure ranging from $1*10^{-3}$ to $1*10^{-7}$ Torr and a temperature ranging from 250° C. to 500° C.

In some embodiments, the casings of the first vapor chamber 110 and the second vapor chamber 130, and the casings of the flexible connecting portion 120 can be connected together simultaneously or sequentially through the vacuum low temperature process to connect the flexible connecting portion 120, the first vapor chamber 110 and the second vapor chamber 130 simultaneously or sequentially so that the inner cavities of the flexible connecting portion 120, the first vapor chamber 110 and the second vapor chamber 130 may communicate with each other.

Referring to FIG. 5, in some embodiments, the first flexible casing 210, i.e. a flexible resin casing, may be a flexible reservoir frame 510. The first flexible casing 210 further includes a first fluid reservoir 516, a second fluid reservoir 518 and a plurality of connecting fluid reservoirs 520. The connecting fluid reservoirs 520 are connected between the first fluid reservoir 516 and the second fluid reservoir 518 to increase the working fluid storage space of the flexible vapor chamber 100. In some embodiments, the capillary strips 140 are traversed in the connecting fluid reservoirs 520 but not limited thereto.

Referring to FIG. 6, the first flexible casing 210 is taken as an exemplary embodiment. The first flexible casing 210 may further utilize a first bonding adhesive 610 and a second bonding adhesive 620 to bond with the second flexible casing 220, or bond on the casings of the vapor chamber. The first bonding adhesive 610 is disposed around the perimeter of the first flexible casing 210, and the second bonding adhesive 620 surrounds inside the first bonding adhesive 610 to seal the flexible vapor chamber 100. In some embodiments, the first bonding adhesive 610 is, for example, epoxy resin protection glue, and the second bonding adhesive 620 is, for example, vacuum glue. In some embodiments, the inner capillary layers 230 are extended to the positions (i.e. the bonding positions) of the first bonding adhesive 610 and the second bonding adhesive 620 to allow the first bonding adhesive 610 and the second bonding adhesive 620 penetrating into a part of the inner capillary layers 230 to increase the adhesive capability.

In some embodiments, the flexible vapor chamber 100 can utilize the flexible connecting portion 120 to form a vapor chamber with flexible capability to reduce a temperature of a heat source. In addition, the flexible vapor chamber 100 can also utilize the flexible connecting portion 120 to connect at least one metal vapor chamber to reduce a temperature of a heat source.

In some embodiments, the flexible connecting portion 120 may further connect to the first vapor chamber 110 and/or the second vapor chamber 130. The first vapor chamber 110 includes a first casing 112 and a second casing 114, and the second vapor chamber 130 includes a first casing 132 and a second casing 134. In some embodiments, the first vapor chamber 110 or the second vapor chamber 130 may include a first bonding adhesive 610 and a second bonding adhesive 620 applied on partial perimeters, where the flexible connecting portion 120 is not connected, of the first casing 112 and the first casing 132 to bond to a corresponding second casing 114 or a corresponding second casing 134 as referred to the first bonding adhesive 610 and the second bonding adhesive 620 applied on the first flexible casing 210 in FIG. 6. In some embodiments, the inner capillary layers 230 are extended to the positions (i.e. bonding positions) of the first bonding adhesive 610 and the second bonding adhesive 620 to allow the first bonding adhesive 610 and the second bonding adhesive 620 penetrating into a part of the inner capillary layers 230 to increase the adhesive capability.

Simultaneously referring to FIG. 5, a first connecting portion 512 and a second connecting portion 514 of the flexible reservoir frame 510 may utilize to bond to external surfaces of the casings of the first vapor chamber 110 and the second vapor chamber 130 to seal the first vapor chamber 110, the second vapor chamber 130 and the flexible connecting portion 120, so that the working fluid may flow in the first vapor chamber 110, the second vapor chamber 130 and the flexible connecting portion 120.

Referring to FIG. 1 and FIG. 2 again, in some embodiments, the capillary strips 140 is preferably extended from one end of the first vapor chamber 110 through the flexible connecting portion 120 to one end of the second vapor chamber 130 so as to span across two ends of the flexible vapor chamber 100. The capillary strips 140 are preferably made of a fibrous material to form capillary fiber strips.

In some embodiments, the inner capillary layers 230 are preferably extended from one end of the first vapor chamber 110 through the flexible connecting portion 120 to one end of the second vapor chamber 130 so as to span across two ends of the flexible vapor chamber 100.

In some embodiments, the flexible vapor chamber 100 may further include a plurality of supporting posts 150 formed between the inner capillary layers 230, and arranged between the capillary strips 140 to provide the casing supporting force for the first vapor chamber 110 and the second vapor chamber 130 to avoid deformation caused by the bending of the flexible vapor chamber 100. In some embodiments, the supporting posts 150 are powder metallurgy supporting posts.

In some embodiments, the first vapor chamber 110 and the second vapor chamber 130 are preferably metal vapor chambers, for example, inflexible metal vapor chambers.

In some embodiments, referring to FIG. 7, the flexible vapor chamber 100 further includes a fluid filling tube 710 formed on a lateral side of the flexible connecting portion 120. In some embodiments, the flexible connecting portion 120 may be equipped at a position of the rotating shaft or the bending mechanism of the electronic device and the fluid filling tube 710 may be hidden in the rotating shaft or the bending mechanism. The flexible vapor chamber 100 may also include a plurality of fluid filling tubes 710 disposed on surfaces of the first vapor chamber 110 and the second vapor chamber 130, without departing from the scope and the spirit of the present invention.

Referring to FIG. 8, the first vapor chamber 110 is taken as an exemplary embodiment. However, the components may also be utilized in the second vapor chamber 130 without departing from the scope and the spirit of the present invention.

A degassing hole 810 and a degassing hole 820 may be formed on the first casing 112 and/or the second casing 114 of the first vapor chamber 110 to fill the working fluid into the vacuum cavity of the flexible vapor chamber 100 and degas therefrom. Subsequently, a sealing film 830 and a sealing film 840 are respectively fixed on the degassing hole 810 and the degassing hole 820 to seal the degassing hole 810 and the degassing hole 820. For example, the sealing film 830 and the sealing film 840 may seal the degassing hole 810 and the degassing hole 820, such as with glue, to seal the vacuum cavity without the fluid filling tube and a fluid filling tube cutting process to advantageously control the conditions of working fluid injection and degassing so as to form a tailless vapor chamber.

In some embodiments, the degassing hole 810 and the degassing hole 820 may mainly formed on the casing of the first vapor chamber 110 and/or the second vapor chamber 130, and the material of the sealing films 830 and the sealing films 840 can be the same with the material of the casing of the vapor chamber.

In some embodiments, the first casing 112 and the second casing 114 of the first vapor chamber 110 may be bonded together by a vacuum low temperature diffusion process, a laser bonding process, a gluing process or a resistance welding process, or the like.

In some embodiments, a plurality of aforementioned degassing holes, such as the degassing holes 810 and the degassing holes 820, can be communicated with the capillary structures, the air flow channels or the storage reservoir in the vacuum cavity so as to improve the efficiency and quality of working fluid injection and degassing.

Hence, according to the structures of the above embodiments, the present invention can provide a required flexible vapor chamber to install in a foldable electronic device so as to reduce the working temperature of the electronic element of the foldable electronic device. In addition, the flexible vapor chamber may combine with more than one metal vapor chamber to improve the heat dissipation efficiency of the flexible vapor chamber. Furthermore, the capillary strips and the inner capillary layers spanned across both ends of the flexible vapor chamber can further increase the heat dissipation efficiency of the flexible vapor chamber. The inner capillary layers may further include through holes to store the working fluid. In addition, the flexible vapor chamber may hide the fluid filling tube in the rotating shaft or bending mechanism of the electronic device.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A flexible vapor chamber, comprising:
   a first flexible casing;
   a second flexible casing;
   a plurality of capillary strips installed between the first flexible casing and the second flexible casing; and
   a plurality of inner capillary layers arranged between the capillary strips and the first flexible casing or the second flexible casing,
   wherein the first flexible casing further comprises:
   a first fluid reservoir;
   a second fluid reservoir; and
   a plurality of connecting fluid reservoirs being connected between the first fluid reservoir and the second fluid reservoir.

2. The flexible vapor chamber of claim 1, wherein the inner capillary layers comprise a plurality of metal wire meshes, a plurality of through holes or a polymeric mesh, and the capillary strips comprise a plurality of capillary fiber strips.

3. The flexible vapor chamber of claim 1, wherein the inner capillary layers respectively comprise a plurality of intersecting through holes, and the intersecting through holes on two adjacent inner capillary layers are at least partially overlapped.

4. The flexible vapor chamber of claim 1, wherein the inner capillary layers respectively comprise a plurality of crisscross through holes.

5. The flexible vapor chamber of claim 1, wherein one of the first flexible casing and the second flexible casing comprises a flexible resin casing.

6. The flexible vapor chamber of claim 5, wherein the flexible resin casing is made of Polyimide (PI).

7. The flexible vapor chamber of claim 5, wherein a surface of the flexible resin casing comprises a surface roughening layer, a nickel plating layer and a copper plating layer.

8. The flexible vapor chamber of claim 7, wherein the surface roughening layer, the nickel plating layer and the copper plating layer are sequentially formed on the surface of the flexible resin casing.

9. The flexible vapor chamber of claim 1, wherein the capillary strips traverse in the connecting fluid reservoirs.

10. The flexible vapor chamber of claim 5, wherein the flexible resin casing further comprises:
    a first bonding adhesive disposed around a perimeter of the flexible resin casing; and
    a second bonding adhesive surrounding inside the first bonding adhesive.

11. The flexible vapor chamber of claim 10, wherein the inner capillary layers are extended to positions of the first bonding adhesive and the second bonding adhesive so that the first bonding adhesive and the second bonding adhesive penetrate into a part of the inner capillary layers.

12. The flexible vapor chamber of claim 1, further comprising a plurality of supporting posts formed between the inner capillary layers and arranged between the capillary strips.

13. The flexible vapor chamber of claim 1, wherein the first flexible casing, the second flexible casing, the capillary strips and the inner capillary layers are formed a flexible connecting portion to connect to a first vapor chamber.

14. The flexible vapor chamber of claim 13, wherein the flexible connecting portion is further connected to a second vapor chamber, and the flexible connecting portion is arranged between the first vapor chamber and the second vapor chamber.

15. The flexible vapor chamber of claim 14, wherein the first vapor chamber and the second vapor chamber respectively comprise a first casing and a second casing, and partial perimeters, without connected to the flexible connecting portion, of the first casing and the second casing, are applied with a first bonding adhesive and a second bonding adhesive to bond the first casing to the second casing, wherein the second bonding adhesive is surrounded inside of the first bonding adhesive.

16. The flexible vapor chamber of claim 15, wherein the inner capillary layers are extended to positions of the first bonding adhesive and the second bonding adhesive so that the first bonding adhesive and the second bonding adhesive penetrate into a part of the inner capillary layers.

17. The flexible vapor chamber of claim 14, wherein the first vapor chamber and the second vapor chamber respectively comprise a first casing and a second casing, a plurality of degassing holes are formed on the first casing or the second casing, and a plurality of sealing films respectively seal the degassing holes after the flexible vapor chamber is filled with a working fluid and degassed.

18. The flexible vapor chamber of claim 17, wherein the sealing films, the first casing and the second casing are made of a same material.

19. The flexible vapor chamber of claim 14, wherein the first vapor chamber and the second vapor chamber are metal vapor chambers.

20. The flexible vapor chamber of claim 14, further comprising a fluid filling tube formed on a lateral side of the flexible connecting portion.

* * * * *